United States Patent [19]
Madou et al.

[11] Patent Number: 5,056,216
[45] Date of Patent: Oct. 15, 1991

[54] METHOD OF FORMING A PLURALITY OF SOLDER CONNECTIONS

[75] Inventors: Marc J. Madou, Palo Alto, Calif.; Scott Gaisford, Hundvag, Norway

[73] Assignee: SRI International, Menlo Park, Calif.

[21] Appl. No.: 470,622

[22] Filed: Jan. 26, 1990

[51] Int. Cl.$^5$ ............................................. H01R 9/09
[52] U.S. Cl. ........................................ 29/843; 29/739; 29/830; 174/263; 228/180.2; 361/411; 428/901
[58] Field of Search .................... 228/180.2; 174/263, 174/264, 265, 267; 361/414, 411; 264/61; 428/901; 427/97; 29/739, 843

[56] References Cited

U.S. PATENT DOCUMENTS

| | | | |
|---|---|---|---|
| 3,373,481 | 3/1968 | Lins et al. | 361/411 X |
| 3,495,133 | 2/1970 | Miller | 361/411 X |
| 4,074,342 | 2/1978 | Honn et al. | 29/830 X |
| 4,349,862 | 9/1982 | Bajorek et al. | 361/411 X |
| 4,661,192 | 4/1987 | McShane | 361/411 X |
| 4,818,728 | 4/1989 | Rai et al. | 29/739 X |

OTHER PUBLICATIONS

IBM Tech. Disclosure Bull., vol. 19, No. 9, Feb. 1977, pp. 3325-3326 by J. D. Larnerd.
IBM Tech. Disclosure Bull. vol. 21, No. 7, Dec. 1978, pp. 2707-2708 by C. S. K. Ng.

*Primary Examiner*—Carl J. Arbes
*Attorney, Agent, or Firm*—Fliesler, Dubb, Meyer & Lovejoy

[57] ABSTRACT

A solder interconnection for forming vias between first and second substrates comprises a plurality of solder containing wells extending into a flat surface of the first substrate, the solder in each well being soldered to one of a corresponding plurality of conductor posts extending outwardly from a flat surface of the second substrate. The plurality of the wells are created in a pattern, an aliquot of solder is deposited in each well, with the aliquots being of substantially no greater volume than that of the well it occupies, the posts are provided in aligned array with the pattern, the solder is melted, the posts are inserted and the solder solidifies. Very closely placed vias can be formed.

14 Claims, 1 Drawing Sheet

FIGURE 1
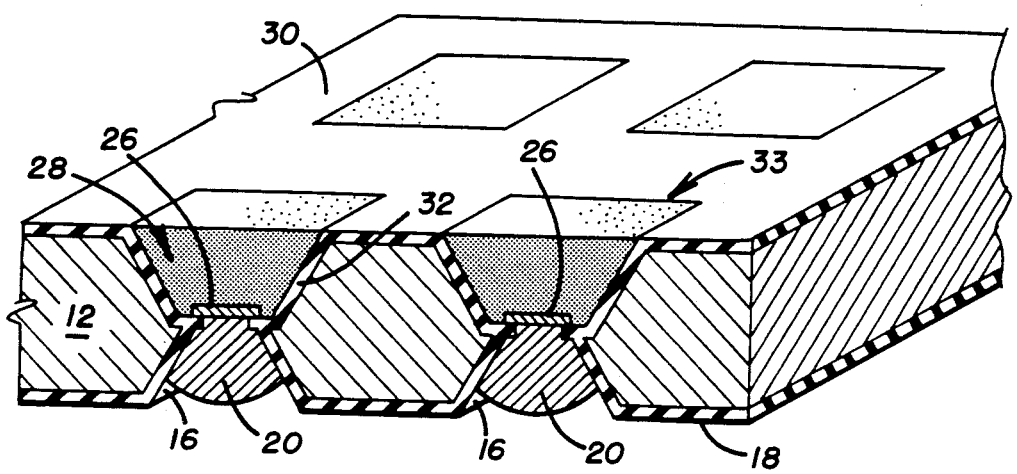
FIGURE 2
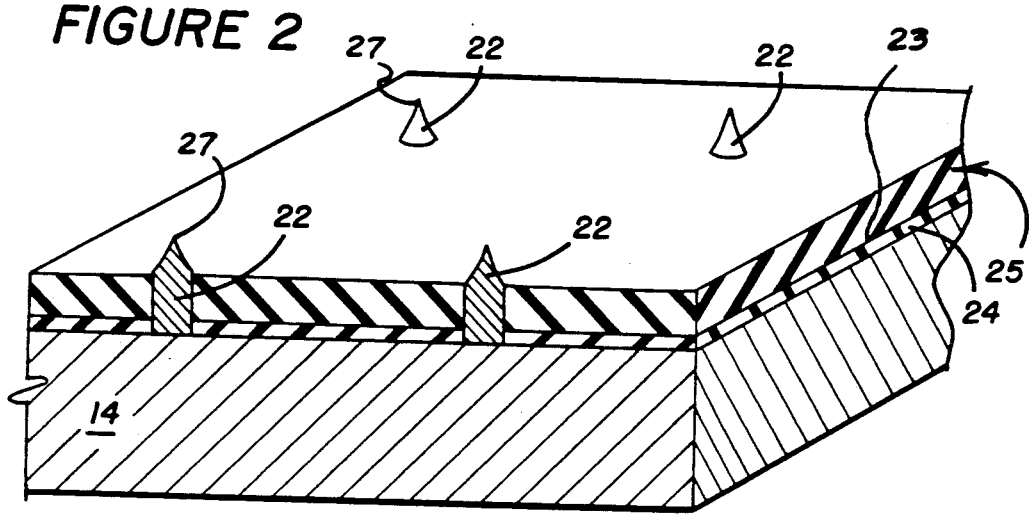
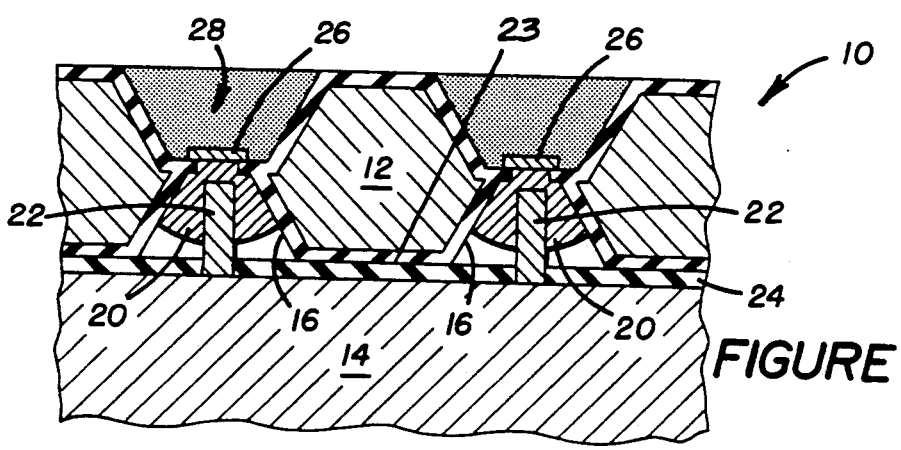
FIGURE 3

METHOD OF FORMING A PLURALITY OF SOLDER CONNECTIONS

DESCRIPTION

1. Technical Field

The present invention relates to interconnection structures for joining a microminiaturized component on one substrate to circuitry on another substrate, and, more particularly, to a structure for forming solder interconnection joints having improved fatigue life and being very close together as well as to a method of making such interconnection structures.

2. Background of the Invention

Use of solder interconnection structures for joining semiconductor devices to substrates is relatively well known in the art. U.S. Pat. No. 4,604,644, issued Aug. 5, 1986 to K. F. Beckham, A. E. Kolman, K. M. McGuire, K. J. Puttlitz and H. Quinones, shows one such solder interconnect structure. The solder interconnection structure of the aforementioned patent, as well as other solder interconnection structures of the art, utilize beads of solder which fit upon the surface of a substrate and which are solderably attached to solder-wettable land pads via melting of the solder when the solder is in contact with the land pads.

The solder interconnection structures of the prior art can flow laterally along the surfaces of the two substrates which are being joined together when the interconnects or vias are formed. This limits how close together the vias are, or, as the term is used in the art, the density of vias attainable. With integrated circuit semiconductor devices being produced in smaller and smaller sizes the need for a very high density of vias, beyond that of the prior art, becomes increasingly important.

It is also desirable to very carefully control where vias are to be positioned. When drops of solder are deposited on a surface a small misplacement of one or more such drops can occur. As a result, any final device which results from soldering, and thereby forming vias between two substrates, can fail simply due to the misplacement of a drop of solder on a surface.

The present invention is directed to overcoming one or more of the problems as set forth above.

DISCLOSURE OF INVENTION

In accordance with an embodiment of the present invention a solder interconnection is set forth for forming I/O (input/output) electrical connections between a first substrate and a second substrate. The interconnection includes a plurality of solder containing wells extending into a flat surface of the first substrate. The solder in each of the wells is in soldered contact with one of a corresponding plurality of conductive posts which extend outwardly from a flat surface of the second substrate.

In accordance with another embodiment of the present invention a method is set forth for forming a plurality of solder I/O connections between a first substrate and a second substrate. A plurality of wells is created arrayed in a pattern and with each well extending into the first substrate from a flat surface thereof. A plurality of aliquots of solder are deposited, one in each of the wells, each of the aliquots being of substantially no greater volume than that of the respective well it occupies. A plurality of conductive posts are provided which extend outwardly from a flat surface of the second substrate. The posts are arrayed in alignment with the pattern of the wells. The first substrate is heated adjacent its flat surface sufficiently to melt the solder in the wells. Each post is inserted into the molten solder in the corresponding well and the solder is allowed to solidify.

A solder interconnection as set forth above can have a very high density of vias between the first substrate and the second substrate. Since the solder is positioned in wells there is an assurance of proper alignment of the solder in each one of the wells with the respective post to which it is in soldered contact. Since each drop of solder is retained by a respective well solder flow along the facing surfaces of the substrates cannot occur whereby shorting between vias is prevented. A polymer, for example, an epoxy resin can advantageously be applied between the two wafers to further reduce the possibility of metal flowing laterally between the surfaces, to prevent fluid from flowing between the substrates if the solder interconnection is immersed in a fluid and to reduce the criticality of alignment of the substrates.

BRIEF DESCRIPTION OF THE DRAWINGS

The invention will be better understood by reference to the figures of the drawings wherein like numbers denote like parts throughout and wherein:

FIG. 1 illustrates, in cross-sectional view, a first substrate in accordance with an embodiment of the present invention;

FIG. 2 illustrate, in cross-sectional view, a second substrate in accordance with an embodiment of the present invention, the FIG. 1 and FIG. 2 substrates being adapted to fit together to form a solder interconnection in accordance with an embodiment of the present invention; and FIG. 3 illustrates, in cross-sectional view, an alternative solder interconnection joining together first and second substrates in accordance with another embodiment of the present invention.

BEST MODE FOR CARRYING OUT INVENTION

In accordance with the present invention a solder interconnection 10 is set forth for forming I/O interconnections between a first substrate 12 and a second substrate 14. There are a plurality of solder containing wells 16 which extend into a flat surface 18 of the first substrate 12. A drop 20 of solder is located in each of the wells 16. As illustrated in FIG. 3 the drops 20 of solder in each of the wells 16 is in soldered contact with one of a corresponding plurality of electrically conductive posts 22 which extend outwardly from a flat surface 23 of the second substrate 14. The term second substrate 14 is used to include a dielectric layer 24, e.g., silicon dioxide, nitride or oxynitride. The flat surfaces 18 and 23 are, in the embodiment of FIG. 3, in abutting relation to one another following formation of the solder interconnection 10. In such an instance, each of the posts 22 must extend no further from the flat surface 23 of the second substrate 14 than the corresponding well 16 extends into the flat surface 18 of the first substrate 12. If desired, the flat surfaces 18 and 23 may be in adjacent but non-touching relationship.

FIGS. 1 and 2 illustrate an embodiment where an intermediate polymeric layer 25 is deposited over one of the flat surfaces 18 and 23 (as shown in FIG. 1 the layer 25 is on the flat surface 23). The layer 25 can serve to increase the effective size of the wells 16 whether it is initially present on the surface 23, as illustrated, or on the surface 18. When the substrates 12 and 14 are brought together with the formation of the solder interconnection 10 the layer 25 is then present and aids in preventing flow of molten solder along the abutting surfaces. It also prevents fluid from flowing laterally between the substrates 12 and 14 if the solder interconnection 10 is immersed. Since the layer 25 is polymeric it has some give thus alleviating stresses whereby alignment of the surfaces 18 and 23 becomes less critical.

The polymeric layer 25, when present, must be a good insulator so as to not conductively interconnect one post 22 or solder drop 20 with another. Generally the polymeric layer 25 is adhesive so as to better hold together the substrates 12 and 14. Preferably the layer 25 is sufficiently flexible or deformable so as to allow correction for any lack of planarity or misalignment of the surfaces 18 and 23. The particular polymer used is a matter of choice although epoxy compounds have been found to work very well.

The polymer layer 25 can be formed by any of a number of techniques. For example, if the posts 22 have reasonably sharp points 27 as illustrated, spin casting, painting or dipping the surface 23 will provide the desired layer 25 with the points 27 extending through the layer 25. If the posts 22 do not have points 27, it is best to use silk screening techniques to assure that the posts 22 extend beyond the layer 25.

Utilizing anisotropic etching technology or laser drilling technology the wells 16 can be placed very close to one another. For example, the spacing on a center-to-center basis of the wells 16 can be less than 100 microns and can generally be as small as 50 microns.

Each of the drops 20 of solder in each of the wells 16 is of substantially no greater volume than the effective volume of the respective well 16 which it occupies. As a result, solder cannot flow laterally along the surfaces 18 and 23 when they are abutting whereby the resulting interconnects or vias formed in the structure shown in FIG. 3 can be quite close together.

In the particular embodiment shown in FIGS. 1 and 2 the solder 20 connects to a conductor, in the embodiment illustrated an electrode 26 at the bottom of a microelectrochemical well 28 on an opposite surface 30 of the first substrate 12. An appropriate insulating layer 32, for example, silicon dioxide, silicon nitride or silicon oxynitride, can be conventionally formed to electrically isolate the first substrate 12 from the electrode 26, where desired and necessary. The resulting product is a microelectrochemical cell 33. The presence of the polymeric layer 25 is particularly advantageous with the microelectrochemical cell 33 since the cell 33 may then be immersed in a fluid to measure dissolved analytes without fear of leakage of the fluid between the substrates 12 and 14.

It should be noted that instead of the microelectrochemical cell 33 as is shown in FIG. 1 the conductor 26 can lead to any desired device, for example, an integrated circuit. Similarly, the posts 22 can be interconnected with any desired device on the second substrate 14, for example, an integrated circuit.

In accordance with the present invention the posts 22 can be created by a modified bump bonder of the type commonly used in semiconductor fabrication. Basically, molten metal is connected to desired spots on the substrate 14 and the bump bonder and the substrate 14 are moved apart thus drawing out and forming the posts 22 as the molten metal solidifies and thereby also providing the points 27. Any desired metal which can be drawn in this manner and which is sufficiently conductive can be used. Gold works particularly well.

The first and second substrates 12 and 14 can be made of any of a number of materials. For example, the substrate may be made of an insulative material, that is, a dielectric material, such as a non-conducting plastic or glass, if, for example, the microelectronic component on the particular substrate 12 or 14 is a microeleotrochemical cell or half-cell which must be electrically isolated. Alternatively, the substrate can be made of a semiconducting material such as silicon or even of a conducting material so long as an appropriate dielectric material isolates the microelectronic component, where necessary.

In accordance with the method of the invention a plurality of solder I/O connections are provided between the first substrate 12 and the second substrate 14. The method of formation comprises creating a plurality of the wells 16 arrayed in a pattern and with each well 16 extending into the first substrate 12 from its flat surface 18 A plurality of aliquots or drops 20 of solder are deposited, one in each of the wells 16. Each of the aliquots or drops 20 are of substantially no greater volume than the volume of the respective well 16 which it occupies. A plurality of conductive posts 22 are provided which extend outwardly from the flat surface 23 of the second substrate 14. The posts 22 are arrayed in alignment with the pattern of the wells 16. The first substrate 12 is heated sufficiently to melt the solder in the wells 16. Each post 22 is inserted into the molten solder in the corresponding one of the wells 16. The solder is then allowed to solidify whereby the solder interconnection 10 is completed.

In accordance with an embodiment of the invention a polymeric layer 25 can be positioned between the flat surfaces 18 and 23 prior to the insertion of the posts 22 in the molten solder in the wells 16.

Industrial Applicability

The present invention provides a solder interconnection 10 for connecting together substrates, for example silicon substrates, whereby a plurality of I/O connections can be made between two substrates 12 and 14. Such is useful for interconnecting integrated circuits and in the formation of microelectrochemical sensors and their interconnection with integrated circuits on a second substrate 14. The vias between the first substrate 12 and the second substrate 14 can be made very close together in accordance with the invention.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

That which is claimed is:

1. A method of forming a plurality of solder I/O connections between a first semiconductor substrate and a second semiconductor substrate, comprising:

creating a plurality of wells arrayed in a pattern, each well extending into said first substrate from a flat surface thereof to a respective well bottom;

providing an electrically insulating layer in each of said wells insulating the first semiconductor substrate from the wells;

providing a respective hole through said insulating layer in each of said wells;

providing a plurality of electrical conductors, one in conductive contact via each representative one of said holes with a corresponding one of said wells;

depositing a plurality of aliquots of solder, one in each of said wells, each of said aliquots being of substantially no greater volume than that of the respective well it occupies, each aliquot being in conductive contact with the respective one of said electrical conductors;

providing a plurality of conductive posts extending outwardly from a flat surface of said second substrate, said posts being arrayed in alignment with the pattern of said wells;

heating said first substrate sufficiently to melt the solder in said wells;

inserting each post into the molten solder in the corresponding one of said wells and allowing said solder to solidify.

2. A method as set forth in claim 1, wherein said wells are created by anisotropic etching.

3. A method as set forth in claim 2, wherein said wells are created by:

bump bonding metal to positions on said flat surface of said second substrate corresponding with the desired array of posts with a bump bonder; and moving said bump bonder and said second substrate apart to draw out said metal and form said posts.

4. A method as set forth in claim 1, wherein said posts are created by:

bump bonding metal to positions on said flat surface of said second substrate corresponding with the desired array of posts with a bump bonder; and moving said bump bonder and said second substrate apart to draw out said metal and form said posts.

5. A method as set forth in claim 1, wherein said first substrate includes an electrochemical sensor and said conductors are each electrodes.

6. A method as set forth in claim 1, wherein said second substrate includes an integrated circuit having an electrode in electrical conductive communication with said posts.

7. A method as set forth in claim 1, wherein each of said posts extends no further from said flat surface of said second substrate than the aligned well extends into said flat surface of said first substrate and wherein said inserting is to a sufficient depth whereby said flat surfaces abut one another.

8. A method as set forth in claim 1, further including, before inserting said posts into the molten solder:

positioning a polymeric layer between said flat surfaces.

9. A method as set forth in claim 8, wherein said wells are created by anisotropic etching.

10. A method as set forth in claim 9, wherein said posts are created by:

bump bonding metal to positions on said flat surface of said second substrate corresponding with the desired array of posts with a bump bonder; and moving said bump bonder and said second substrate apart to draw out said metal and form said posts.

11. A method as set forth in claim 8, wherein said posts are created by:

bump bonding metal to positions on said flat surface of said second substrate corresponding with the desired array of posts with a bump bonder; and moving said bump bonder and said second substrate apart to draw out said metal and form said posts.

12. A method as set forth in claim 8, wherein said first substrate includes an electrochemical sensor and said conductors are each electrodes.

13. A method as set forth in claim 8, wherein said second substrate includes an integrated circuit having an electrode in electrical conductive communication with said posts.

14. A method as set forth in claim 1, wherein said conductors each pass through that portion of the respective insulating layer covering the respective well bottom.

* * * * *